(12) United States Patent
Schröer et al.

(10) Patent No.: US 7,064,960 B2
(45) Date of Patent: Jun. 20, 2006

(54) ARRANGEMENT FOR SIGNAL TRANSMISSION BETWEEN A TRANSMITTER AND A CONTROL UNIT

(75) Inventors: Frank Schröer, Welden (DE); Rainer Huscher, Waldershof (DE)

(73) Assignee: Nexans, Paris (FR)

( * ) Notice: Subject to any disclaimer, the term of this patent is extended or adjusted under 35 U.S.C. 154(b) by 372 days.

(21) Appl. No.: 10/736,579

(22) Filed: Dec. 17, 2003

(65) Prior Publication Data
US 2004/0178678 A1      Sep. 16, 2004

(30) Foreign Application Priority Data
Dec. 18, 2002   (DE)   ............................... 102 59 124

(51) Int. Cl.
*H05K 5/00*      (2006.01)
*H01L 23/02*     (2006.01)

(52) U.S. Cl. ..................... 361/752; 361/797; 174/52.6

(58) Field of Classification Search ............... 174/52.6; 361/752, 797
See application file for complete search history.

(56) References Cited
FOREIGN PATENT DOCUMENTS

| DE | 3221223 | A1 | 12/1983 |
|----|---------|-----|---------|
| DE | 3319735 | C2 | 12/1983 |
| DE | 43 25 501 | A1 | 2/1995 |
| DE | 196 17 038 | A1 | 11/1997 |
| DE | 196 34 139 | A1 | 2/1998 |
| DE | 198 43 594 | A1 | 4/2000 |
| DE | 199 43 986 | A1 | 3/2001 |
| DE | 100 51 055 | A1 | 5/2002 |
| DE | 101 07 121 | A1 | 8/2002 |
| EP | 1 108 834 | A2 | 6/2001 |

*Primary Examiner*—Brian Sircus
*Assistant Examiner*—Hal I. Kaplan
(74) *Attorney, Agent, or Firm*—Sughrue Mion, PLLC

(57) ABSTRACT

A signal transmission arrangement is proposed wherein the transmitter has an electronic circuit that can be connected to an electrical voltage source, and the electronic circuit, via electrical wires (13, 14) connected thereto, can be connected with the voltage source and the control unit of the transmitter. The arrangement further has a metallic plate (16) made of an electrically conducting material, which is associated with the circuit and acts as a sensor. This electronic circuit is arranged in a moisture-tight way in a plastic housing (G) into which the lines (13, 14) are run in a moisture-tight manner. The plate (16) is arranged in an outwardly open cavity located in a wall of the housing (G) and its outer flat surface is covered in a moisture-tight manner by a layer (18) of flexible insulating material that fits tightly and without any gaps against the plate (16).

5 Claims, 2 Drawing Sheets

ARRANGEMENT FOR SIGNAL TRANSMISSION BETWEEN A TRANSMITTER AND A CONTROL UNIT

BACKGROUND OF THE INVENTION

The invention relates to an arrangement for signal transmission between a transmitter and a control unit. The transmitter has an electronic circuit that can be connected to an electrical voltage source. The electronic circuit, via electrical lines connected therewith, can be connected to the voltage source and the control unit. The transmitter further has a metallic plate made of a material which is a good electrical conductor, which is associated with the circuit and acts as a sensor.

Such an arrangement is used, for example, in motor vehicles. It can trigger a specified function when an operator's hand contacts it or approaches it. One possible field of application for such an arrangement is, for example, the doors of convertibles whose door windows, in their closed position, reach up into the roof of the vehicle for reasons of stability. Before opening a door, it is therefore necessary to lower the corresponding door window far enough so that it disengages from the roof.

Suitable systems for this purpose are commercially available. They are installed in a known manner in the handle recess of the doors of a motor vehicle so as to respond upon approach of, or contact with, a driver's hand, such that the corresponding door window is lowered by a specified distance. This is accomplished via a signal transmitted to a control unit, which controls a motor connected with the door window. For this purpose, the arrangement is equipped with a sensor and electronics that trigger the signal through the hand contacting the door handle. Problems may occur with these systems due to the influence of weather, because it is especially hard to avoid moisture on and in the vehicle doors. This can interfere with the electronics.

SUMMARY OF THE INVENTION

An object of the invention is to design the arrangement of the type described above in such a way that it can be easily made moisture-tight.

According to the invention, this object is attained by mounting the electronic circuit moisture-tight inside a plastic housing into which the lines are run in a moisture-tight manner, and arranging the plate in an outwardly open cavity located in a wall of the housing and covering it in a moisture-tight manner on its flat outer surface by a layer of flexible insulating material that fits tightly and without any gaps against the plate.

In this arrangement, an electronic circuit can be used, on which the electronic components are mounted using conventional techniques, e.g., on a circuit card. The entire electronic circuit is accommodated in a moisture tight manner inside the plastic housing, so that no additional measures are required to protect its electronic components against moisture. This is also true for the metal plate which is connected with the circuit and receives an electrical voltage and which is disposed in a wall of the housing such that it is accessible from the outside. Its flat outer surface is covered in a moisture-tight manner without any gaps by a flexible insulating material, such that it has reproducible characteristics undistorted by air bubbles with respect to a hand approaching it.

The cavity for receiving the plate is preferably an opening made in the housing. The circuit or the circuit card and plate can be interconnected by way of prefabrication and inserted into the housing as a unit. The lines, too, can already be connected to the circuit ahead of time.

BRIEF DESCRIPTION OF THE DRAWINGS

An exemplary embodiment of the invention is depicted in the drawings in which.

DETAILED DESCRIPTION OF THE INVENTION

Figure 1:
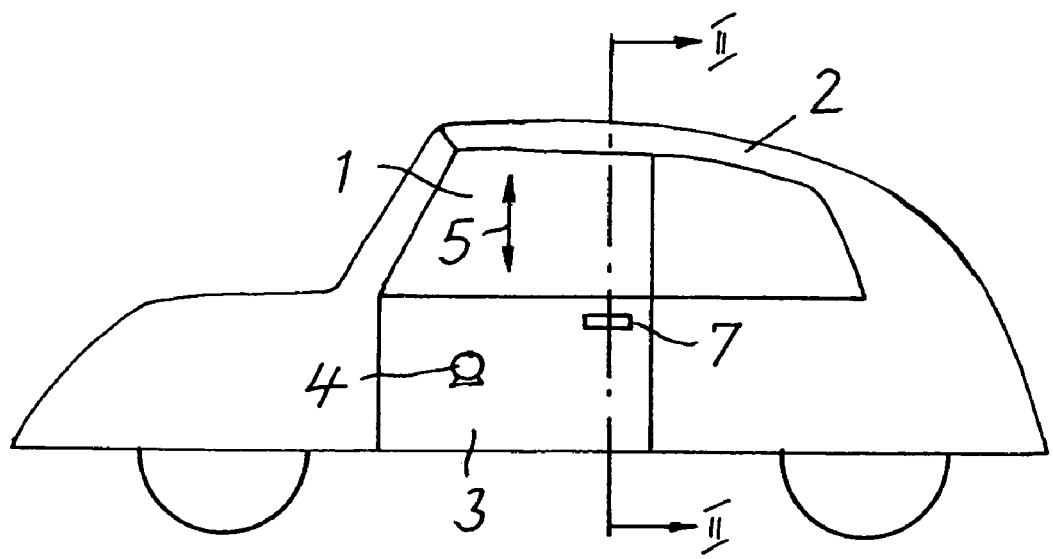
FIG. 1 is a schematic side view of a passenger car.
Figure 2:
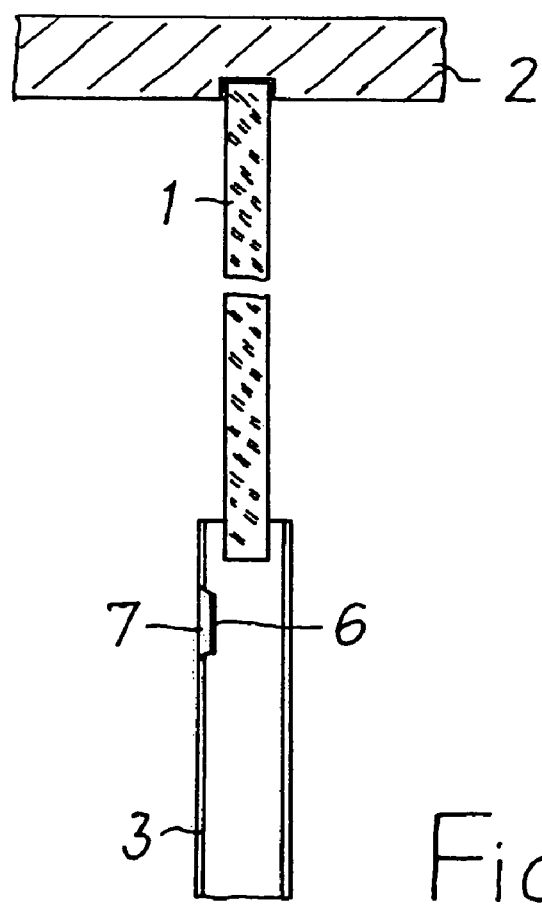
FIG. 2 is a magnified section of a door of the passenger car taken along the line II—II of FIG. 1.
Figure 3:
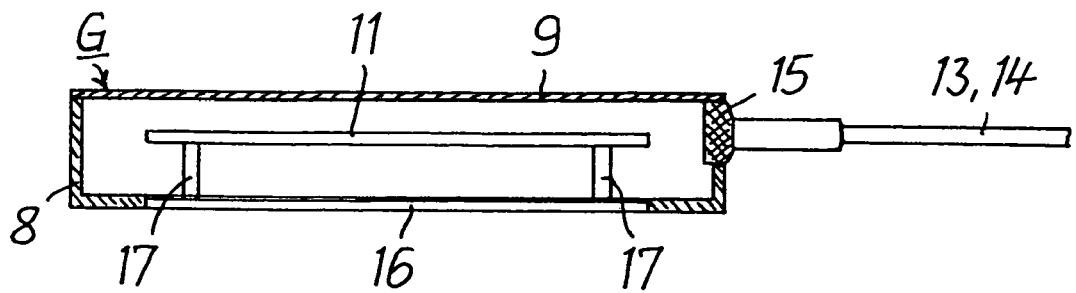
FIGS. 3 to 5 are various magnified views of the arrangement according to the invention.
Figure 4:
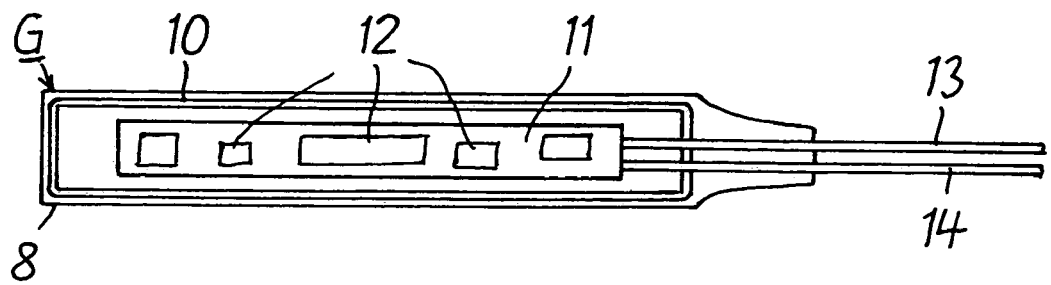

The passenger car depicted in FIG. 1 is a convertible, the door windows of which are not equipped with separate frames. When the door window 1 is closed, it engages with the top 2 of the passenger car such that the top is firmly sealed. The door window 1 can be displaced in the directions of the double arrow 5 by an electrically driven motor 4 arranged in the door 3 of the passenger car. Using an arrangement 6 depicted in greater detail in FIGS. 3 to 5, the window can be moved down a small distance such that it disengages from the top 2. The door 3 can then be opened. The arrangement 6 is mounted, for example, in the area of a handle recess 7 in the door 3 of the passenger car (FIG. 2).

The arrangement 6 can be actuated, for example, by the driver of the passenger car. To actuate it, the driver must first transmit a signal, which also activates, for example, the other electronics of the passenger car. A corresponding transmitter is typically integrated into the handle of the vehicle key.

The arrangement 6 includes a housing G made of a mechanically stable plastic, e.g., polyamide, which has a box shaped bottom part 8 and a cover 9. When the cover 9 is placed onto the bottom part 8, the housing G is sealed in a moisture-tight manner. To this end, a circumferential seal 10, which is preferably disposed in a corresponding groove of the bottom part 8, may be provided between the two parts.

Inside the housing G, an electronic circuit 11 is disposed whose schematically indicated components 12 are preferably mounted on a circuit card. Electrical lines 13 and 14 are connected to the electronic circuit 11. One of these lines is connected with a voltage source present in the passenger car, e.g., the vehicle battery, and the other with a control unit that is likewise present in the passenger car. In the area where the lines 13 and 14 run into the housing G, a sealing element 15 is disposed in a recess made in the housing, which seals the insertion area in a moisture-tight manner.

Figure 5:
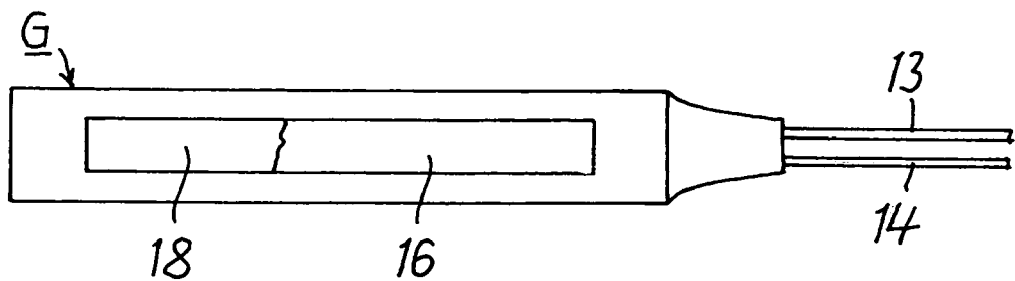

The housing G further accommodates a metallic plate 16 that is made of a material which is a good electrical conductor and acts as a sensor. It is electrically connected to the electronic circuit 11 and thus receives an electrical voltage. The plate 16 and the circuit 11 together form the transmitter of the arrangement 6. The two components can be mechanically interconnected by means of supports 17 to form a unit. In the embodiment shown, the plate 16 is mounted in an outwardly open cavity located in a wall of the housing G. This cavity is preferably located in the bottom part 8 of the housing. It is thus disposed in the housing G so as to be accessible from the outside, as shown in FIG. 5. The plate 16 is mounted in a moisture-tight manner in the wall of the housing G. A layer 18 of a flexible insulating material fits tightly and without any gaps against the outer flat surface of the plate 16. It serves on the one hand as a moisture-tight cover of the plate 16 and on the other hand as a protection against accidental contact. The layer 18 is made, for example, of a thermoplastic polymer.

The arrangement 6 according to the invention works, for example, as follows:

The fully assembled arrangement 6, i.e., the housing G sealed against moisture, is mounted in the area of the handle recess 7 in the door 3 of a passenger car. The plate 16 is then located on the side facing the door recess 7. The door 3 can have an opening in the door recess 7, which corresponds to the size of the plate 16. In its mounted position the electronic circuit 11 is connected via the lines 13 and 14 with the voltage source and the control unit of the passenger car.

To enable the door 3 of the passenger car to be opened, the door window 1 must be moved down far enough so that it disengages from the top 2. For this purpose, the arrangement 6 and thus its transmitter must first be activated by a signal triggered by the driver. When the driver then brings his hand near the plate 16, which also includes touching the layer 18 that covers the plate 16, the capacitance of the transmitter, which consists of the plate 16 and the circuit 11, changes. The transmitter sends a corresponding signal to the control unit of the passenger car, which switches on the motor 4 for lowering the door window 1 long enough so that the window disengages from the top 2. The door 3 can then be opened. The gap-free cover of the plate 16 ensures that the corresponding change in the capacitance has the same values within narrow limits.

In the embodiment given by way of example, the arrangement according to the invention is described as a "door opener." However, it may also be used for other suitable purposes in a motor vehicle, e.g., to adjust the seats.

What is claimed is:

1. An arrangement for signal transmission between a transmitter and a control unit, in which the transmitter has an electronic circuit that can be connected to an electrical voltage source and, using electrical lines connected therewith can be connected with the voltage source and the control unit, and a metallic plate made of a material which is a good electrical conductor, which is associated with the circuit and acts as a sensor, characterized in that the electronic circuit (11) is mounted in a moisture-tight manner in a plastic housing (G) into which the lines (13, 14) run in a moisture-tight manner, and the plate (16) is arranged in an outwardly open cavity located in a wall of the housing (G) and is covered in a moisture-tight manner on its outward flat surface by a layer (18) of flexible insulating material, which fits against the plate (16) tightly and without any gaps.

2. An arrangement as claimed in claim 1, characterized in that the electronic circuit (11) is mounted on a printed circuit board.

3. An arrangement as claimed in claim 1, characterized in that the housing (G) comprises a box-like bottom part (8) and a cover (9) between which a circumferential seal (10) is disposed.

4. An arrangement as claimed in claim 3, characterized in that the bottom part (8) has a recess in which a sealing element (15) is disposed which encloses the lines (13, 14) in a moisture-tight manner.

5. An arrangement as claimed in claim 1, characterized in that the wall of the housing (G) is perforated completely to form the cavity receiving the plate (16).

\* \* \* \* \*